United States Patent
Takahashi

(10) Patent No.: US 7,911,863 B2
(45) Date of Patent: Mar. 22, 2011

(54) SEMICONDUCTOR DEVICE AND DRAM CONTROLLER

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 307 days.

(21) Appl. No.: 12/212,159

(22) Filed: Sep. 17, 2008

(65) Prior Publication Data

US 2009/0080234 A1 Mar. 26, 2009

(30) Foreign Application Priority Data

Sep. 21, 2007 (JP) ................................. 2007-244704

(51) Int. Cl.
*G11C 7/02* (2006.01)
(52) U.S. Cl. ....................................... 365/207; 365/149
(58) Field of Classification Search .................. 365/207, 365/203, 149, 226
See application file for complete search history.

(56) References Cited

U.S. PATENT DOCUMENTS

| | | | | |
|---|---|---|---|---|
| 5,477,498 A | * | 12/1995 | Ooishi | 365/208 |
| 5,905,685 A | * | 5/1999 | Nakamura et al. | 365/207 |
| 5,982,673 A | * | 11/1999 | Kiehl | 365/189.15 |
| 6,424,577 B2 | * | 7/2002 | Sim | 365/189.05 |

FOREIGN PATENT DOCUMENTS

JP 2004-220753 8/2004

* cited by examiner

*Primary Examiner* — Anh Phung
(74) *Attorney, Agent, or Firm* — Young & Thompson

(57) ABSTRACT

According to a semiconductor device of the present invention, a differential potential between a sense amplification level and a precharge level of a sense amplifier is set to a power supply potential (VCC-GND) so as to improve resistance against degradation of hold characteristics. Further, low power consumption can be realized along with the improvement. Additionally, the precharge level is set to a power supply of GND or VCC so as to realize a stable supply of the precharge level. Further, a chip size can be reduced since a power supply circuit for precharge is not needed.

17 Claims, 7 Drawing Sheets

SEMICONDUCTOR DEVICE AND DRAM CONTROLLER

BACKGROUND OF THE INVENTION

1. Field of the Invention

The present invention relates to a semiconductor device, and more specifically, to a sense operation of a DRAM.

2. Description of Related Art

In recent years, in a semiconductor device used in a communication device or a high-end computer, low power consumption or high-speed access has been required.

Along with the low power consumption or the high-speed operation, highly enhanced performance has been required in the DRAM. More specifically, a power supply voltage input to the DRAM has been reducing.

FIG. 7 shows waveforms showing an operation of a typical DRAM. Although the detailed description is omitted, sensing is performed by raising a sense amplifier activating signal SAE with a word line W being raised. A bit line pair D and DB, which has been precharged to an intermediate potential ½ VCC between a power supply voltage VCC and a ground voltage GND before starting the sensing, is set to a true complement differential potential (ΔV in FIG. 7) in accordance with the cell state. Then the bit line pair D and DB is amplified to the power supply voltage and the ground voltage, respectively. FIG. 7 shows a sensing in which information of a cell (also referred to as cell H) storing "1" is amplified to the bit line D side.

The reduced voltage described above means that the differential potential between VCC and GND in FIG. 7 decreases. In other words, the amplitude of the bit line pair D and DB decreases. Therefore, a charge amount determining the cell state described above also decreases as the amplitude potential decreases.

It is also expected in the DRAM to not only reduce voltage but also reduce power consumption. In order to attain these objects, it is desired to extend a cycle of refreshing storage elements, which is one factor of determining the power consumed by the DRAM. To be more specific, it is desired to improve the degradation of hold characteristics along with the miniaturization of the DRAM device.

Generally, in a cell employing an Nch transistor, the hold characteristics of the DRAM cell is determined by the fact that the charge of the cell storing "1" is drawn out, which means that the differential potential ΔV shown in FIG. 7 is made smaller. Finally, when the sense amplifier cannot determine that the potential difference described above is higher with respect to ½ VCC, then the false sense is generated and the cell is determined as hold failure.

The above description assumes that the DRAM cell is formed by the Nch transistor and a capacitor; however the DRAM cell may be formed by a Pch transistor and a capacitor.

Further, the high-speed operation of the DRAM device has been expected within a limit of low voltage and low power consumption.

A technique of increasing the speed of the DRAM device with low voltage is disclosed in the following patent document, for example.

Japanese Unexamined Patent Application Publication No. 2004-220753 (Ueda) discloses a technique of applying the potential below the ground to a low potential side of the power supply voltage of the sense amplifier for only a brief period of time for the purpose of increasing the sensing speed of the sense amplifier.

However, in the related art, improvement of the hold characteristics of the DRAM cell has not been considered. Therefore, decrease of the power consumption has not been considered.

Therefore, in Ueda, the precharge voltage of the sense amplifier is set to ½ VCC, which is half the power supply voltage VCC. In this case, when the charge amount held in the cell decreases as the voltage decreases, the hold time of the cell is extremely reduced.

As a result, refresh interval performed on the DRAM cell needs to be made shorter in order to ensure the hold characteristics of the DRAM cell, which increases the power consumption.

SUMMARY

A semiconductor device according to one aspect of the present invention includes a DRAM cell, a sense amplifier amplifying information stored in the DRAM cell, a power supply circuit to which a power supply voltage and a ground voltage are input, and a sense amplifier control circuit controlling a power supply pair input to the sense amplifier, in which the sense amplifier precharges a potential of a bit line pair to a power supply potential or a ground potential before amplifying the information stored in the DRAM cell, the DRAM cell being connected to either one or the bit line pair, and the sense amplifier control circuit controls the power supply pair input to the sense amplifier so that a potential difference of the bit line pair becomes larger than a differential potential between the power supply voltage and the ground voltage when the sense amplifier performs an amplification operation.

As described above, according to the present invention, the operation speed of the sense amplifier can be increased and the operation of the sense amplifier can be made stable with low voltage while addressing the degradation of the hold characteristics of the memory cell. Accordingly, the power consumption can be reduced since the good hold characteristics can be attained.

Further, there is no need to provide the power supply circuit generating the precharge level of the sense amplifier, whereby the chip size can be reduced. Additionally, since the amplitude voltage of the bit line pair and the sense amplifier power supply pair are increased by applying the existing positive high voltage and negative voltage, it is possible to increase the speed of the sensing operation while minimizing chip penalty.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

The embodiments of the present invention will be described in detail with reference to the drawings in order to best describe the above and other objects, characteristics, and effects.

First Embodiment

Figure 1:
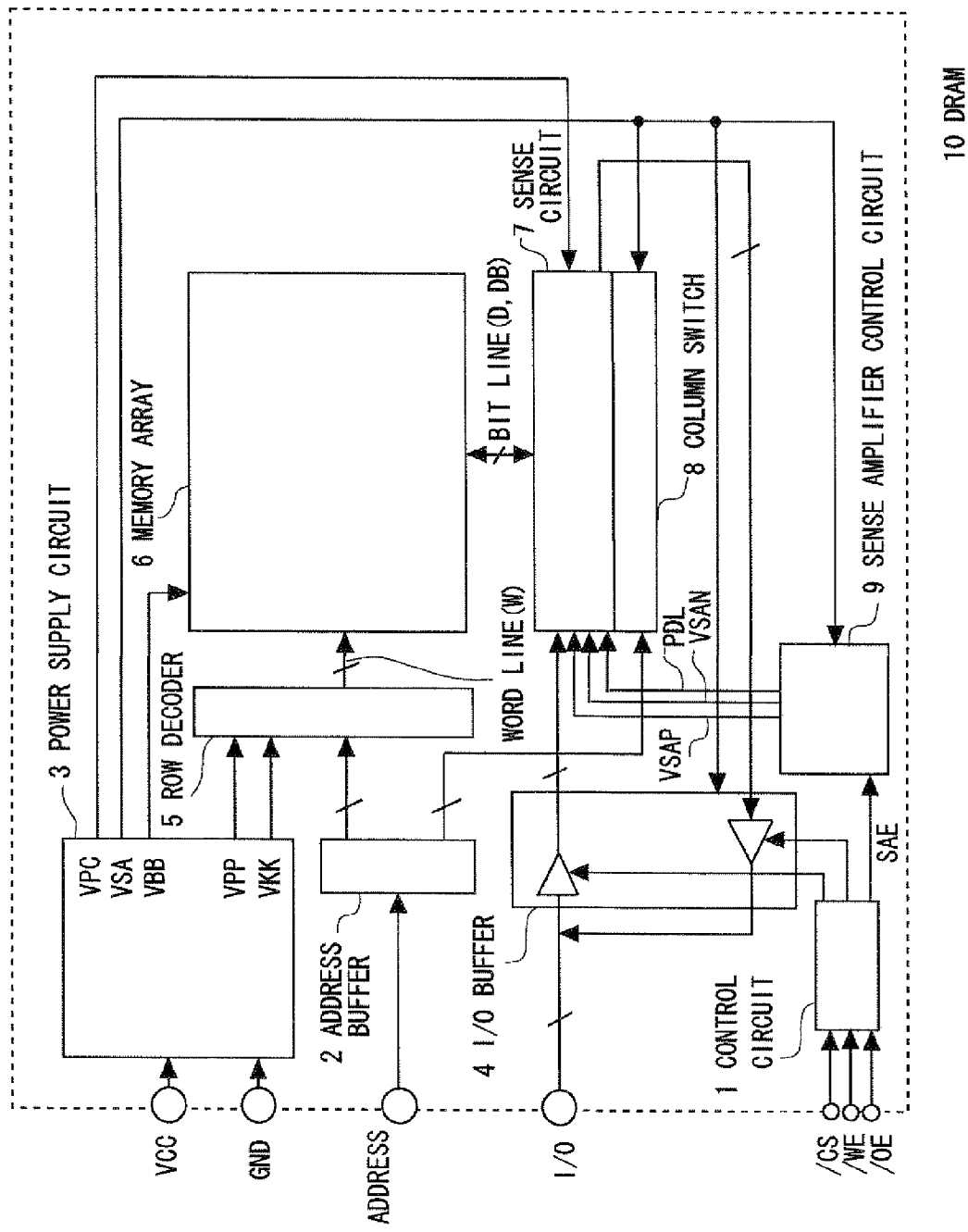
FIG. 1 is a diagram showing a whole semiconductor device according to a first embodiment of the present invention.

FIG. 1 is a diagram showing a whole semiconductor device according to the first embodiment of the present invention.

A DRAM 10 in FIG. 1 includes a power supply circuit 3 to which a power supply voltage VCC and a ground voltage GND are input. The power supply circuit 3 generates voltage VPP which is higher than the power supply voltage, or VSA, VPP, VKK which are lower than the ground voltage. Although the example is shown in which voltages such as VPP mentioned above are generated inside the DRAM, those voltages can be directly input from an external part of the DRAM.

VPP and VKK of those voltages are input to a row decoder 5 and are supplied to a gate of a DRAM cell of a memory array 6 through a word line W. VBB is supplied to the memory array 6 as a back gate voltage of the DRAM cell.

VSA is input to a sense amplifier control circuit 9, a column switch 8, and an I/O buffer 4 so as to control selection/non-selection of a column system of bit lines D and DB. VPC is input to a sense circuit so as to precharge the power supply and the bit line of the sense circuit to VPC.

The row decoder 5, the memory array 6, and the sense circuit 7 shown in FIG. 1 will be specifically described with reference to FIG. 2 for the purpose of describing the present embodiment in more detail. FIG. 3 shows a circuit controlling the power supply of the sense amplifier 70 of the sense circuit of FIG. 2.

First, the configuration of FIG. 2 will be described in detail. The row decoder 5 includes a word driver 51 and outputs a selected voltage VPP or a non-selected voltage VKK to the word line W.

The memory array 6 includes a memory cell 61 formed by one transistor and one capacitor. The transistor has a gate connected to the word line described above, one of a source and a drain connected to the bit line, and the other of the source and the drain connected to the capacitor. Then (D+DB)/2, which is half the potential amplified by the bit line pair D and DB, is applied to a side of the capacitor not connected to the transistor (hereinafter referred to as cell counter electrode). The back gate of the transistor is connected to VBB. The potential of the cell counter electrode may be the ground voltage or the power supply voltage. The back gate may be the ground voltage.

The sense amplifier 70 of the sense circuit 7 is the typical latch-type sense amplifier and amplifies the potential of the bit line pair D and DB. The bit line pair D and DB and a sense amplifier power supply pair VSAP and VSAN are set to the precharge potential VPC (also referred to as equalizing) around the amplification operation. An equalizer for bit line 72 and an equalizer for sense amplifier power supply 71 formed by Nch transistors are provided in the bit line pair and the sense amplifier power supply line pair, respectively.

Further, the sense amplifier control circuit 9 generating the sense amplifier power supply pair VSAP and VSAN described above will be described with reference to FIG. 3. A sense amplifier activating signal SAE and a negative voltage VSA are input to the sense amplifier control circuit 9. The sense amplifier control circuit 9 includes a negative voltage level shifter 11 only in the VSAN output side. This is because the level of the SAE signal having the amplitude between VCC and GND is shifted to the amplitude between VCC and the negative voltage. In the above description, it is assumed that VSA is the negative voltage, and the description has been made on a case in which the negative voltage level shifter is provided in the VSAN side. However, as will be described later in detail, a positive voltage level shifter needs to be provided in the VSAP side when VSA is in the positive voltage higher than VCC.

Figure 3:
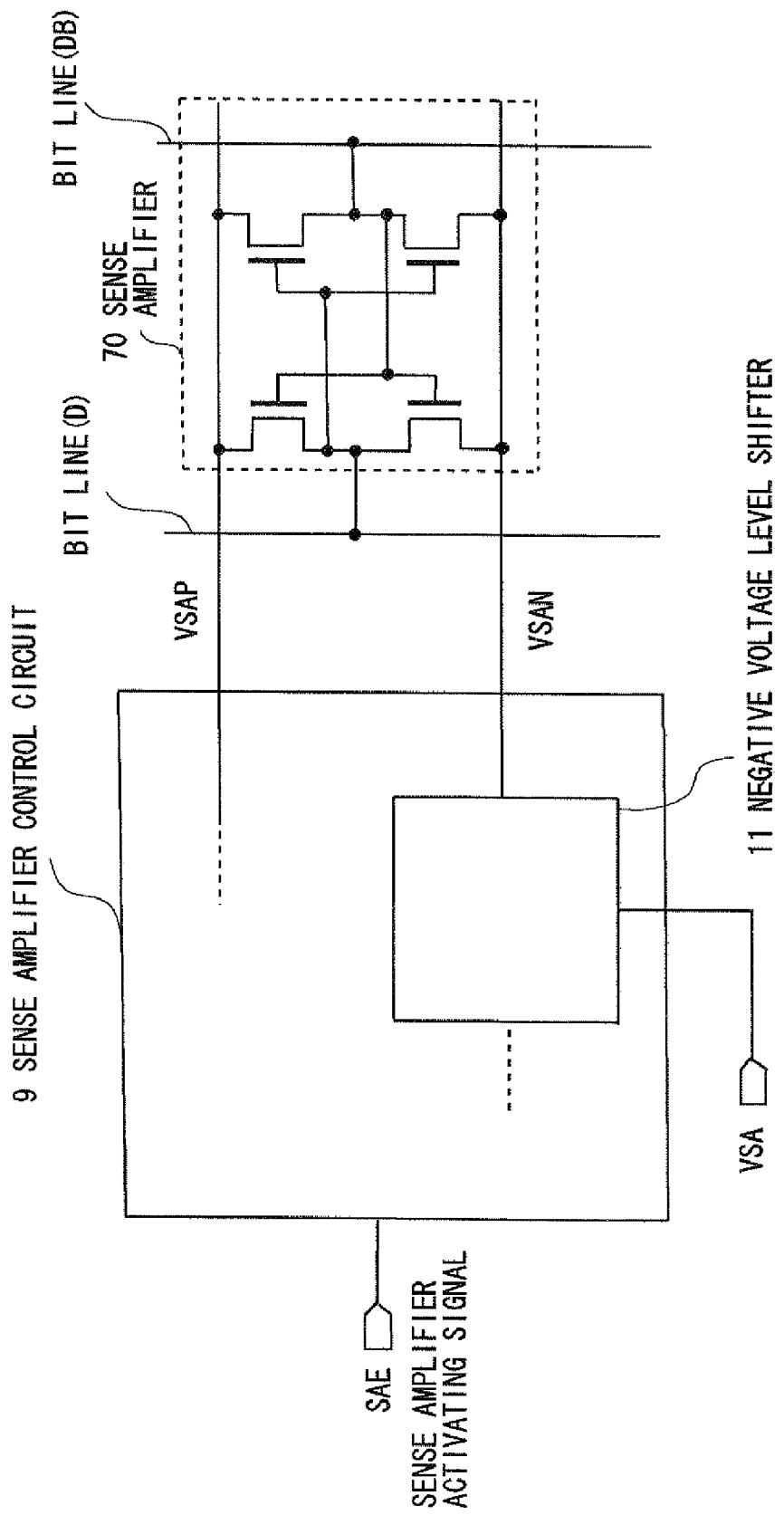
FIG. 3 is a diagram showing a part of the semiconductor device according to the first embodiment of the present invention.
Figure 4:
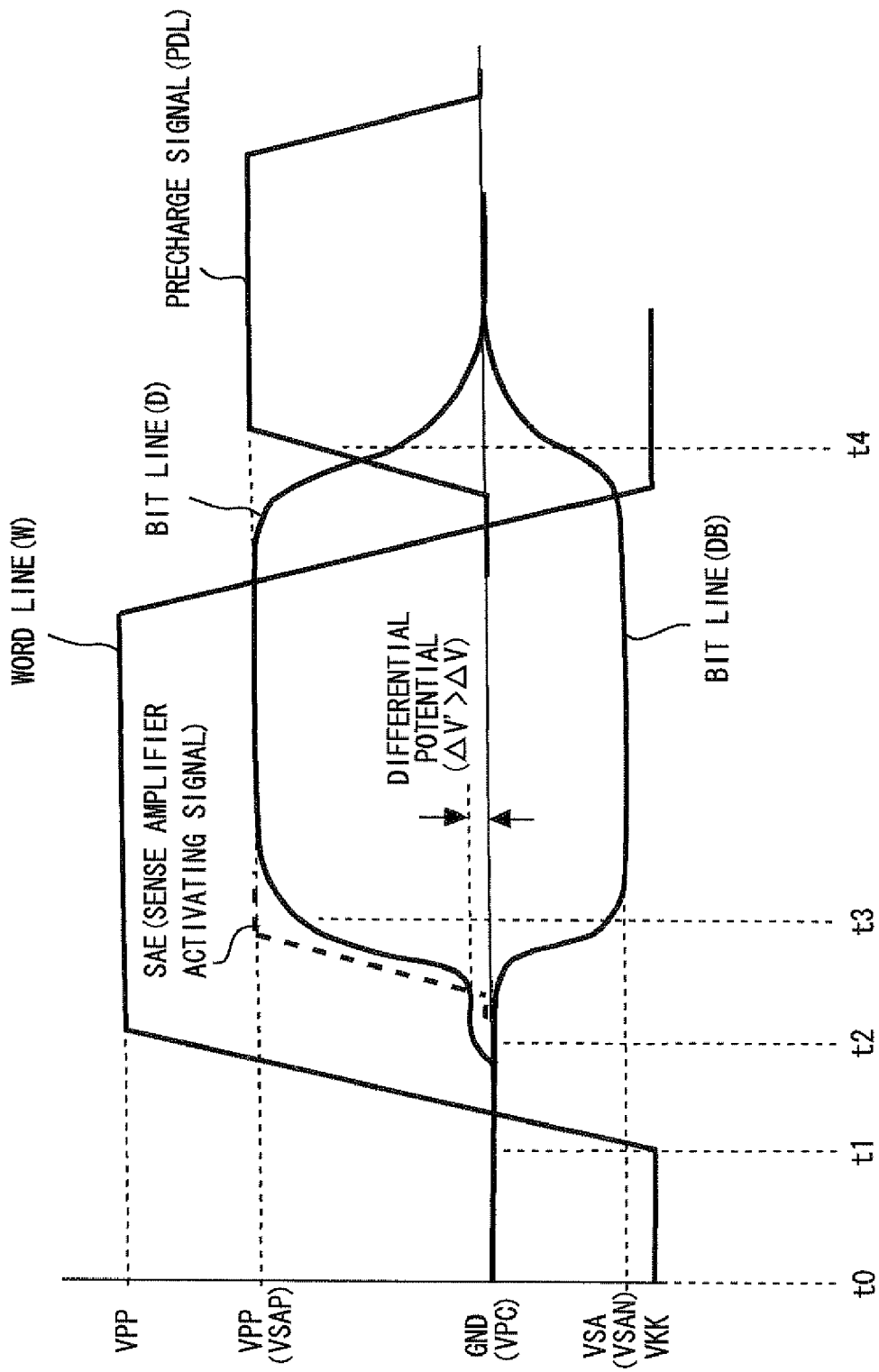
FIG. 4 is a diagram showing an operation of the semiconductor device according to the first embodiment of the present invention.

The configuration of the present embodiment has been described above with reference to FIGS. 1, 2, and 3. In FIG. 4, the operation of the present embodiment will be described with representative contact point potential of FIGS. 1, 2, and 3 described above.

In FIG. 4, a longitudinal axis indicates potential and a horizontal axis indicates time. With t0 to t4 set to a specific time in the time axis, each event generated in the DRAM for each time will be described.

At the time t0 to t1, the word line W is in an inactive state and is set to the non-selected voltage VKK (negative voltage). The voltage VKK is set to the negative voltage in order to address subthreshold leak of the Nch transistor forming the DRAM cell.

At this time, the sense amplifier power supply pair VSAP and VSAN and the bit line pair D and DB are set to the precharge level VPC (=GND level). By setting the precharge level to the GND level instead of conventional VCC/2, the resistance against degradation of the hold characteristics of the cell H is improved. The cell H is recognized even if the cell H is subjected to the hold degrading by lowering the level (=precharge level) while the condition to produce the cell H is not changed at all. At the same time, the circuit generating VCC/2 which has been required in the related art is not needed. In addition, since the existing power supply line which is relatively in the stable state is used, the precharge level can be made stable.

Figure 7:
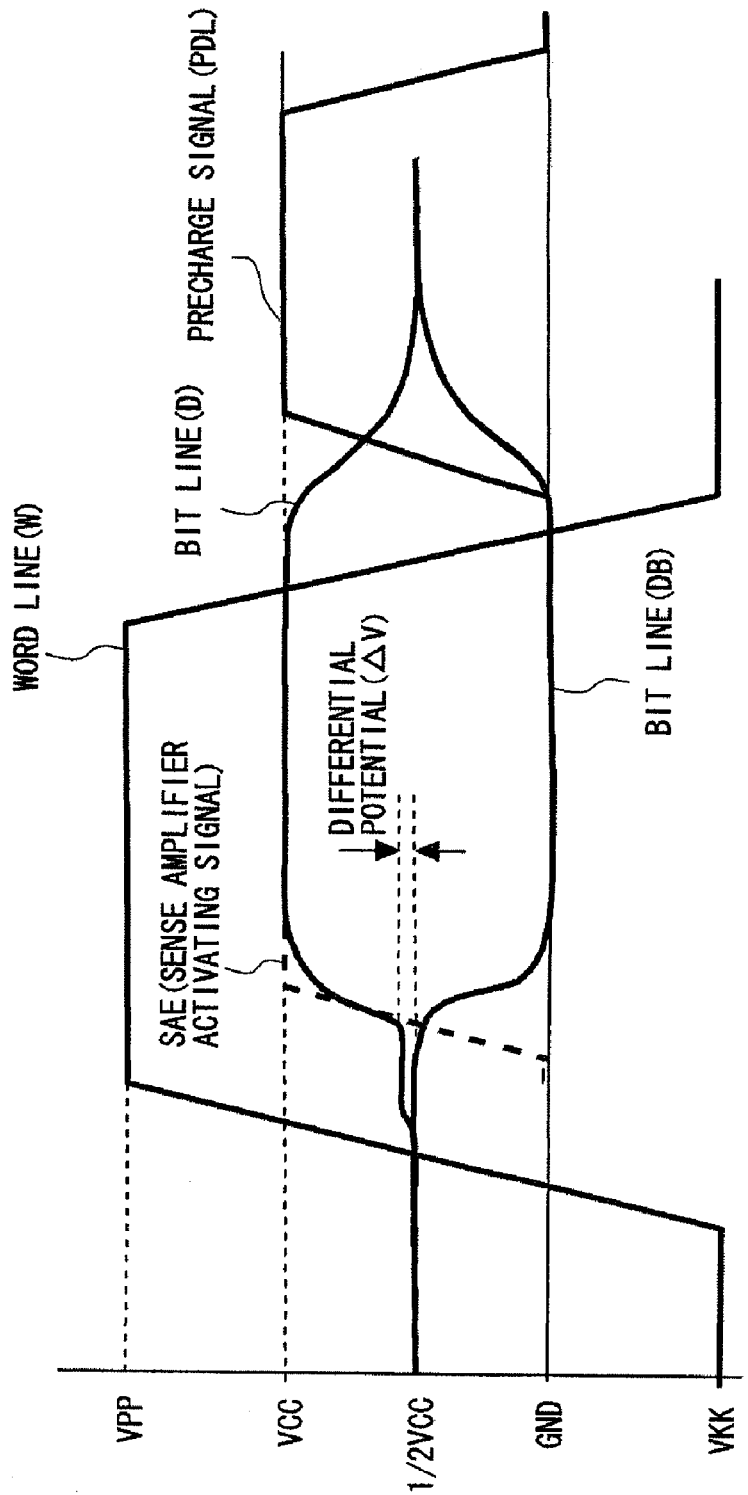
FIG. 7 is a diagram for explaining a problem with a related semiconductor device.

At the time t1 to t2, the word line W is activated. The word line W is boosted to the voltage higher than the power supply voltage in order to absorb the threshold value voltage of the Nch transistor forming the DRAM cell. Then the potential difference is generated in the bit line based on the information stored in the DRAM cell. In this description, a case in which a reading target cell connected to the bit line D is "1" (=cell H) is described. By changing the precharge level from ½VCC to the GND level, the differential potential theoretically increases. The differential potential is changed from $\Delta V$ (shown in FIG. 7) to $\Delta V'$ ($>\Delta V$) (shown in FIG. 4) when the precharge level is ½VCC.

At the time t2 to t3, the sense amplifier activating signal SAE is activated (voltage is raised from the GND level to the VCC level). In order to prevent the drawing from being complicated by overlapping the waveforms, steps before and after a step of transiting the sense amplifier activating signal have been omitted. Then the potential difference of the bit line described above is amplified. The bit line D is amplified to VSAP or VCC level and DB is amplified to the negative voltage VSAN or VSA level.

Finally, upon completion of the sense operation, the word line W is fallen. Then at the time t4, the precharge signal PDL is activated so as to produce the state of the time t0 before the operation start.

Although the description has been made on a case in which the non-selected level VKK of the word line W is lower than the final level of the bit line DB or VSA level, the relative relation may be the same or reversed. This is because each potential is determined by different factors. More specifically, the VKK level is determined by the subthreshold characteristics of the DRAM cell transistor, whereas the VSA level is determined by circuit factors such as operation sensitivity of the sense amplifier or the ability of the step-down circuit, or withstand voltage of the transistor receiving VSA.

Further, the VSA level itself (negative voltage in this embodiment) can be made rather flexible. This is because the sense amplifier is formed by flip flop. In other words, a D side of the bit line pair is amulified to VCC in this embodiment. Therefore, since the D side is significantly amplified, the flip flop circuit can determine the contact point potential without depending on the other DB side.

Second Embodiment

Figure 5:
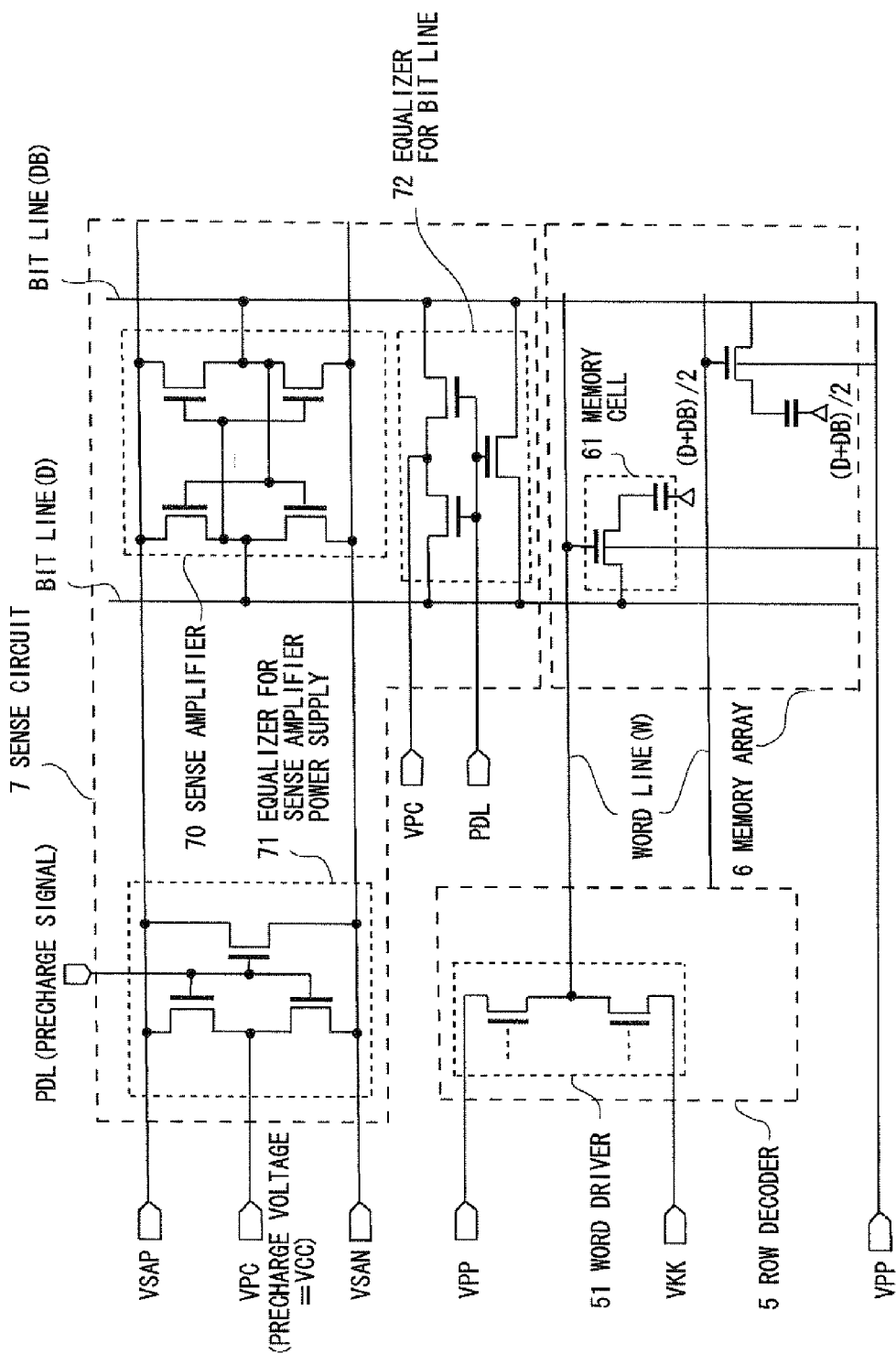
FIG. 5 is a diagram showing a part of a semiconductor device according to a second embodiment of the present invention.
Figure 6:
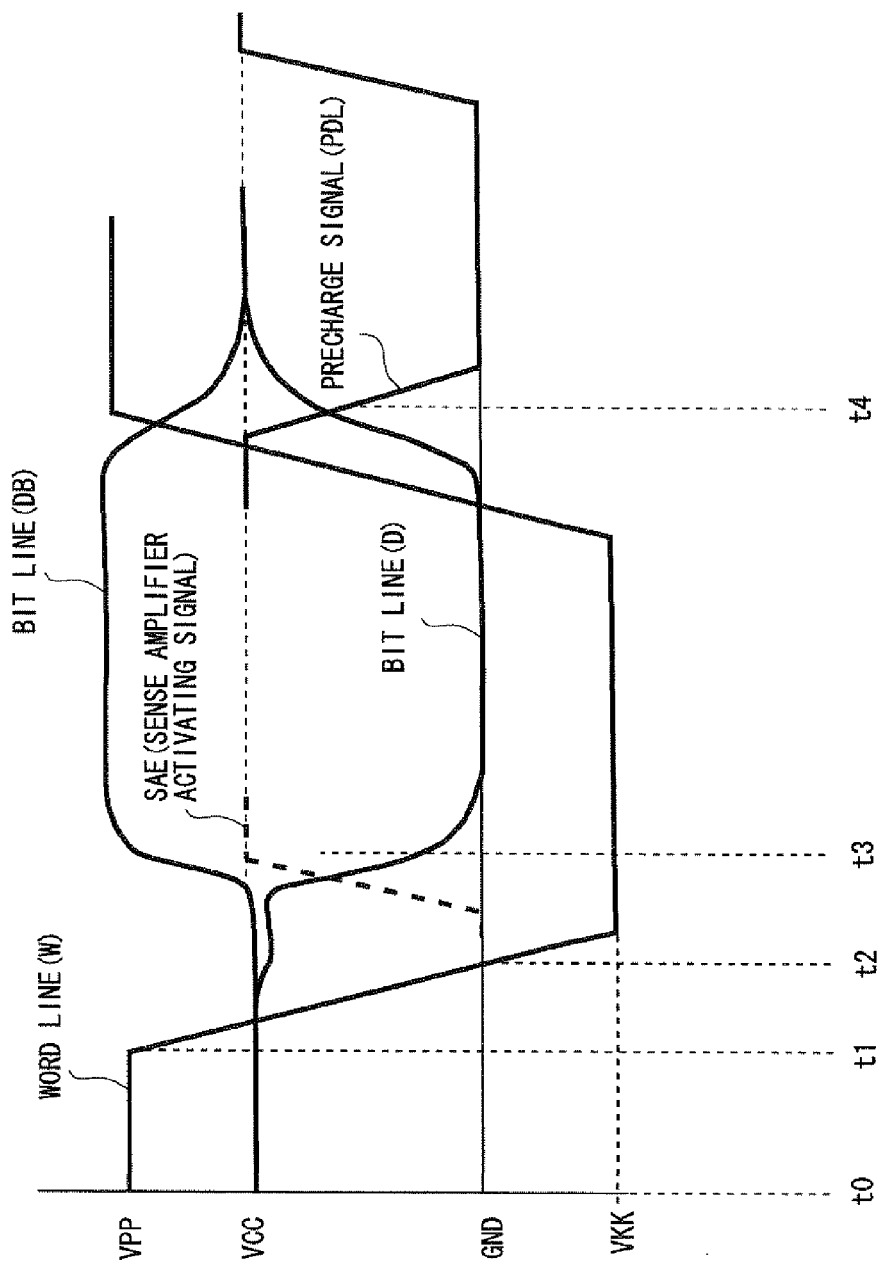
FIG. 6 is a diagram showing an operation of the semiconductor device according to the second embodiment of the present invention.

Now, an example of forming the DRAM cell transistor by the Pch transistor will be described. The whole image is the same as that in FIG. 1. As is the same as in FIG. 2, FIG. 5 shows a circuit diagram showing a part of the DRAM cell. FIG. 6 shows operational waveforms thereof. The parts different from those in the first embodiment will now be described with reference to FIGS. 5 and 6.

Figure 2:
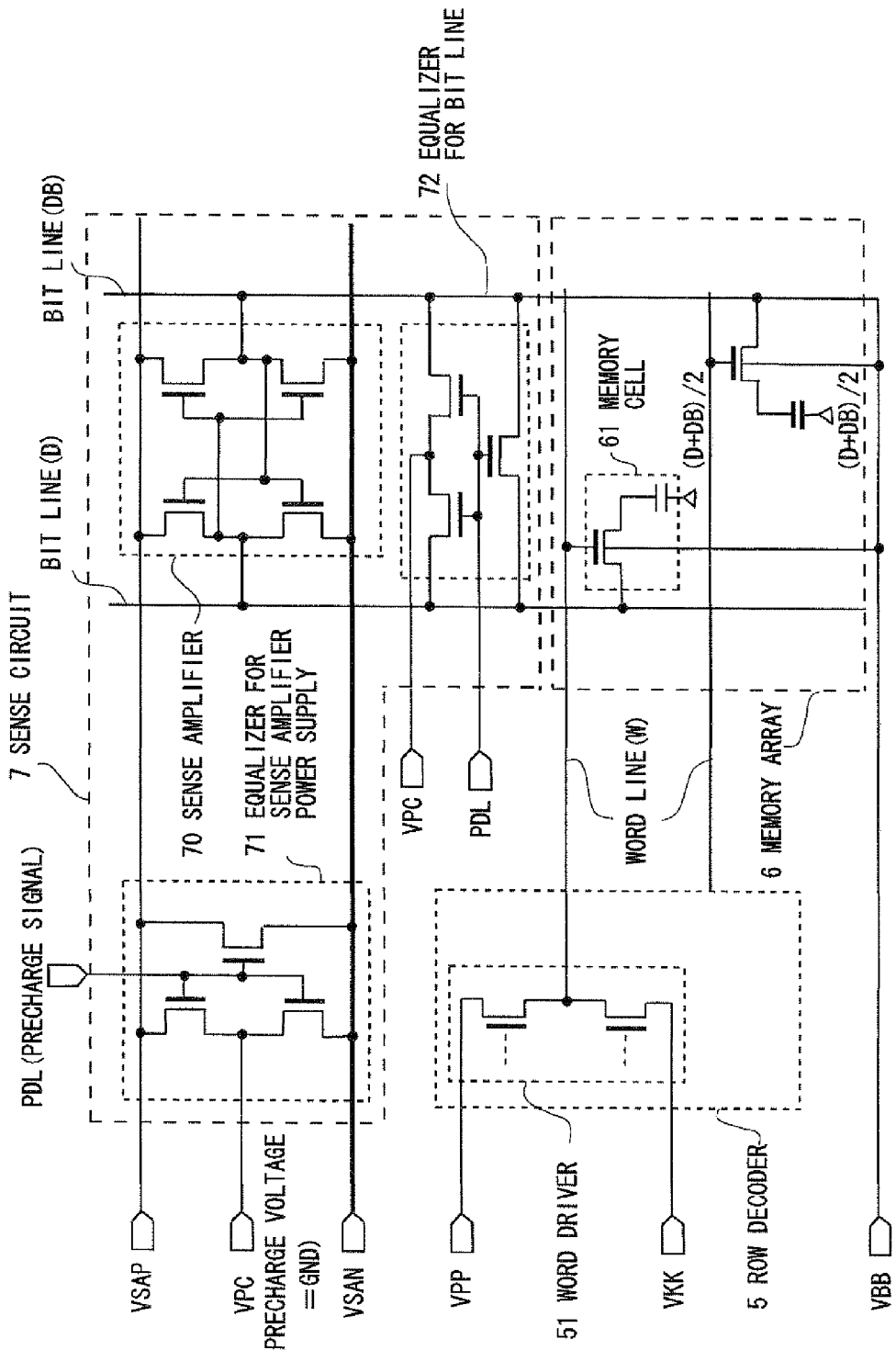
FIG. 2 is a diagram showing a part of the semiconductor device according to the first embodiment of the present invention.

The configuration of the DRAM cell transistor in the second embodiment is almost the same as that in the first embodiment shown in FIG. 2. However, in the second embodiment, the memory cell 61 in FIG. 5 is the Pch transistor. The positive high voltage VPP is applied to the back gate voltage.

The precharge level which is the GND level in the first embodiment is set to the VCC level. Therefore, the equalizer for sense amplifier power supply 71 and the equalizer for bit line 72 are desirably formed by the Pch transistors.

The circuit operation of the present embodiment will be described with reference to FIG. 6. In the first embodiment, the similar description has been made with reference to FIG. 4. FIG. 6 shows waveforms of a case in which the cell (cell L) storing "0" is connected to the bit line D.

The cell L is described because the sub potential of the transistor is reversed and the hold characteristics is determined by the cell L when the DRAM cell is formed by the Pch transistor. This phenomenon will be described later in detail.

In FIG. 6, at the time t0 to t1, the word line W is in the inactive state and is set to the non-selected voltage VPP (positive voltage). The VPP addresses the subthreshold leak of the Pch transistor forming the DRAM cell.

At this time, the sense amplifier power supply pair VSAP and VSAN and the bit line pair D and DB are set to the precharge level VPC (=VCC level). By setting the precharge level to the VCC level instead of conventional VCC/2, the resistance of the hold characteristics or the cell L is improved.

At the time t1 to t2, the word line W is activated. Then the potential difference is generated in the bit line based on the information stored in the DRAM cell. In this description, a case in which the reading target cell connected to the bit line D is "0" (=cell L) is described.

At the time t2 to t3, the sense amplifier activating signal is activated (voltage is raised from the GND level to the VCC level). Then the potential difference of the bit line described above is amplified. The bit line D is amplified to VSAN or GND level and the bit line DB is amplified to the positive voltage VSAP or VPP level.

Finally, upon completion of the sense operation, the word line W is raised. Then at the time t4, the precharge signal PDL is activated so as to produce the state of the time t0 before the operation start.

As is the same as in the first embodiment, the differential potential between the amplitude level of the bit line potential of a side determining the hold characteristics of the cell and the precharge level is secured by the value of the power supply potential VCC.

Now, the degradation model of the hold characteristics when the Nch transistor or the Pch transistor is used will be described in brief.

When the Nch transistor is used, the charge is drawn out from an N-type diffusion layer of a charge holding node to a P sub by junction leak. Therefore, the cell H determines the hold characteristics. On the other hand, when the Pch transistor is employed, the cell L determines the hold characteristics since the charge is injected from an N sub to a P-type diffusion layer.

Now, an advantage obtained by employing the Pch transistor for the cell is described. First, the Pch transistor has a high resistance against soft error.

Generally, the radiation generates electrons and holes, which are made incident on a diffusion layer which is a storage node. As a result, the data in the storage node may be inverted. This is known as soft error. The Nch transistor is influenced by the electrons, and the Pch transistor is influenced by the holes.

If it is assumed that the Nc and Pch transistors have the same conditions (transistor size or the like), then the difference of the mobility of the carrier subjected to the influence seems to determine the impact of the influence. In summary, the electrons having a large mobility with respect to the holes have more adverse effect. Accordingly, the Nch transistor influenced by the electrons is more likely to generate the soft error.

Note that the present invention is not limited to the above embodiments but can be changed as appropriate within a spirit of the present invention. For example, in the above embodiments, the example of the cell transistor of either Nch or Pch has been described. However, the Nch cell transistor and the Pch cell transistor may be mixedly arranged.

For example, in a case of the Nch transistor cell, the precharge level may employ the power supply from the external part if possible. Note that, in this case, it is necessary that the power supply is more stable and lower than the ground potential.

Although the control signal and various voltages according to modes are generated in the DRAM in each embodiment of the present invention, they may be generated by a memory controller in the external part of the memory, for example.

It is apparent that the present invention is not limited to the above embodiments, but may be modified and changed without departing from the scope and spirit of the invention.

What is claimed is:
1. A semiconductor device, comprising:
   a DRAM cell;
   a sense amplifier to which a power supply pair is input, the power supply pair including a first power supply and a second power supply;

a power supply circuit to which a power supply voltage and a ground voltage are input; and a sense amplifier control circuit determining a potential of the power supply pair, wherein the sense amplifier precharges a potential of a bit line pair to a power supply potential or a ground potential before amplifying information stored in the DRAM cell, the DRAM cell being connected to either one of the bit line pair, and the sense amplifier control circuit controls the power supply pair so that a potential difference of the bit line pair becomes larger than a differential potential between the power supply voltage and the ground voltage when the sense amplifier performs an amplification operation.

2. The semiconductor device according to claim 1, wherein the DRAM cell comprises:
an Nch transistor; and
a capacitor connected to the Nch transistor.

3. The semiconductor device according to claim 1, wherein the DRAM cell comprises:
a Pch transistor; and
a capacitor connected to the Pch transistor.

4. The semiconductor device according to claim 2, wherein when the selected DRAM cell stores charge in the capacitor to store "1" state,
the sense amplifier amplifies a potential of one bit line of the bit line pair connected to the DRAM cell to the power supply voltage and amplifies a potential of the other bit line to a first voltage which is lower than the ground voltage.

5. The semiconductor device according to claim 3, wherein when the selected DRAM cell stores charge in the capacitor to store "1" state,
the sense amplifier amplifies a potential of one bit line of the bit line pair connected to the DRAM cell to the ground voltage and amplifies a potential of the other bit line to a second voltage which is higher than the power supply voltage.

6. The semiconductor device according to claim 2, further comprising an equalizer equalizing the potential of the power supply pair and/or the potential of the bit line pair, the equalizer being formed by an Nch transistor.

7. The semiconductor device according to claim 3, further comprising an equalizer equalizing the potential of the power supply pair and/or the potential of the bit line pair, the equalizer being formed by a Pch transistor.

8. The semiconductor device according to claim 2, wherein the sense amplifier control circuit further comprises a negative voltage level shifter, and
the negative voltage level shifter converts an amplitude between the power supply voltage and the ground voltage of a signal input to the sense amplifier control circuit into an amplitude between the power supply voltage and a negative voltage lower than the ground voltage.

9. The semiconductor device according to claim 3, wherein the sense amplifier control circuit further comprises a positive voltage level shifter, and the positive voltage level shifter converts an amplitude between the power supply voltage and the ground voltage of a signal input to the sense amplifier control circuit into an amplitude between a positive voltage higher than the power supply voltage and the ground voltage.

10. The semiconductor device according to claim 2, wherein a back gate voltage of the DRAM cell is lower than the ground voltage.

11. The semiconductor device according to claim 3, wherein a back gate voltage of the DRAM cell is higher than the power supply voltage.

12. The semiconductor device according to claim 1, wherein the power supply circuit further comprises a step-up circuit and/or a step-down circuit.

13. The semiconductor device according to claim 2, wherein an intermediate potential between two potentials obtained by amplifying the bit line pair by the sense amplifier is input to one contact of the capacitor.

14. The semiconductor device according to claim 3, wherein an intermediate potential between two potentials obtained by amplifying the bit line pair by the sense amplifier is input to one contact of the capacitor.

15. The semiconductor device according to claim 1, further comprising a control circuit, the control circuit generating a sense amplifier activating signal controlling an amplification operation of the sense amplifier.

16. A semiconductor device, comprising:
a DRAM cell;
a sense circuit to which a power supply pair is input, the power supply pair including a first power supply and a second power supply;
a power supply circuit to which a power supply voltage and a ground voltage are input; and
a sense amplifier control circuit determining a potential of the power supply pair, wherein
the sense circuit precharges a potential of a bit line pair to a power supply potential or a ground potential before amplifying information stored in the DRAM cell, the DRAM cell being connected to either one of the bit line pair, and
the sense amplifier control circuit sets a potential of the first power supply to be higher than the power supply voltage or sets a potential of the second power supply to be lower than the ground voltage when the sense circuit performs an amplification operation.

17. A DRAM controller, comprising:
setting a potential of a bit line pair to a potential same to one of a power supply potential and a ground potential, the DRAM cell being connected to one of the bit line pair;
supplying selected voltage to a word line connected to the DRAM cell; and
amplifying a potential difference generated in the bit line pair to be larger than a differential potential between the power supply voltage and the ground voltage.

* * * * *